US011437777B2

(12) United States Patent
Tanaka et al.

(10) Patent No.: US 11,437,777 B2
(45) Date of Patent: Sep. 6, 2022

(54) METHOD FOR TUNING EMISSION WAVELENGTH OF LASER DEVICE

(71) Applicant: Sumitomo Electric Device Innovations, Inc., Yokohama (JP)

(72) Inventors: Hirokazu Tanaka, Yokohama (JP); Kento Komatsu, Yokohama (JP)

(73) Assignee: Sumitomo Electric Device Innovations, Inc., Yokohama (JP)

(*) Notice: Subject to any disclaimer, the term of this patent is extended or adjusted under 35 U.S.C. 154(b) by 79 days.

(21) Appl. No.: 16/454,801

(22) Filed: Jun. 27, 2019

(65) Prior Publication Data

US 2020/0006916 A1  Jan. 2, 2020

(30) Foreign Application Priority Data

Jun. 27, 2018 (JP) .............................. JP2018-121496

(51) Int. Cl.
| *H01S 5/06* | (2006.01) |
| *H01S 5/068* | (2006.01) |
| *H01S 5/0625* | (2006.01) |
| *H01S 5/12* | (2021.01) |
| *H01S 5/024* | (2006.01) |
| *H01S 5/026* | (2006.01) |
| *H01S 5/0687* | (2006.01) |

(Continued)

(52) U.S. Cl.
CPC .......... *H01S 5/0612* (2013.01); *H01S 5/0265* (2013.01); *H01S 5/02415* (2013.01); *H01S 5/02438* (2013.01); *H01S 5/02453* (2013.01); *H01S 5/068* (2013.01); *H01S 5/0617* (2013.01); *H01S 5/0687* (2013.01); *H01S 5/06256* (2013.01); *H01S 5/06258* (2013.01); *H01S 5/06804* (2013.01); *H01S 5/1209* (2013.01); *H01S 5/1212* (2013.01); *H01S 5/0287* (2013.01); *H01S 5/3434* (2013.01); *H01S 5/34373* (2013.01)

(58) Field of Classification Search
CPC .. H01S 5/02453; H01S 5/0607; H01S 5/0612; H01S 5/06804; H01S 5/06825
See application file for complete search history.

(56) References Cited

U.S. PATENT DOCUMENTS

| 2004/0066812 A1* | 4/2004 | Nagano ............... H01S 5/02453 |
| | | 372/34 |
| 2005/0213621 A1* | 9/2005 | Varga .................... H01S 5/0683 |
| | | 372/38.02 |

(Continued)

FOREIGN PATENT DOCUMENTS

| JP | H8-056030 A | 2/1996 |
| JP | 2009-26996 A | 2/2009 |

*Primary Examiner* — Sean P Hagan
(74) *Attorney, Agent, or Firm* — Baker Botts L.L.P.; Michael A. Sartori

(57) ABSTRACT

A method for tuning an emission wavelength of a laser device, including: acquiring a drive condition of a wavelength tunable laser diode to make the wavelength tunable laser diode oscillate at a wavelength from a memory; driving a first thermo-cooler and a first heater based on the drive condition of the wavelength tunable laser diode; determining whether respective control values of the first thermo-cooler and the first heater are reached within a first range of target values; and driving a gain region after the control values have been reached within the first range.

7 Claims, 10 Drawing Sheets

(51) Int. Cl.
   *H01S 5/343* (2006.01)
   *H01S 5/028* (2006.01)

(56) References Cited

U.S. PATENT DOCUMENTS

2009/0022186 A1   1/2009  Tanaka et al.
2014/0036940 A1*  2/2014  Tanaka .................. H01S 5/141
                                                  372/20

* cited by examiner

Fig. 3

| Ch | \multicolumn{7}{c|}{INITIAL SET VALUES} | \multicolumn{2}{c|}{FEEDBACK CONTROL TARGET VALUES} |

| Ch | $I_{LD}$ [mA] | $I_{SOA}$ [mA] | $T_{LD}$ [degC] | $T_{Etalon}$ [degC] | $P_{Heater1}$ [mW] | $P_{Heater2}$ [mW] | $P_{Heater3}$ [mW] | $I_{m1}$ [μA] | $I_{m2}/I_{m1}$ A.U. |
|---|---|---|---|---|---|---|---|---|---|
| 1 | 150.00 | 67.39 | 52.508 | 50.000 | 29.42 | 57.47 | 50.69 | 315.0 | 1.175 |
| 2 | 150.00 | 47.74 | 34.533 | 50.000 | 64.38 | 81.31 | 72.45 | 317.5 | 1.518 |
| 3 | 150.00 | 50.86 | 38.727 | 50.000 | 59.05 | 77.71 | 69.12 | 313.0 | 1.229 |
| ... | ... | ... | ... | ... | ... | ... | ... | ... | ... |
| n | 150.00 | 54.77 | 54.046 | 50.000 | 41.24 | 43.32 | 11.69 | 317.2 | 1.441 |

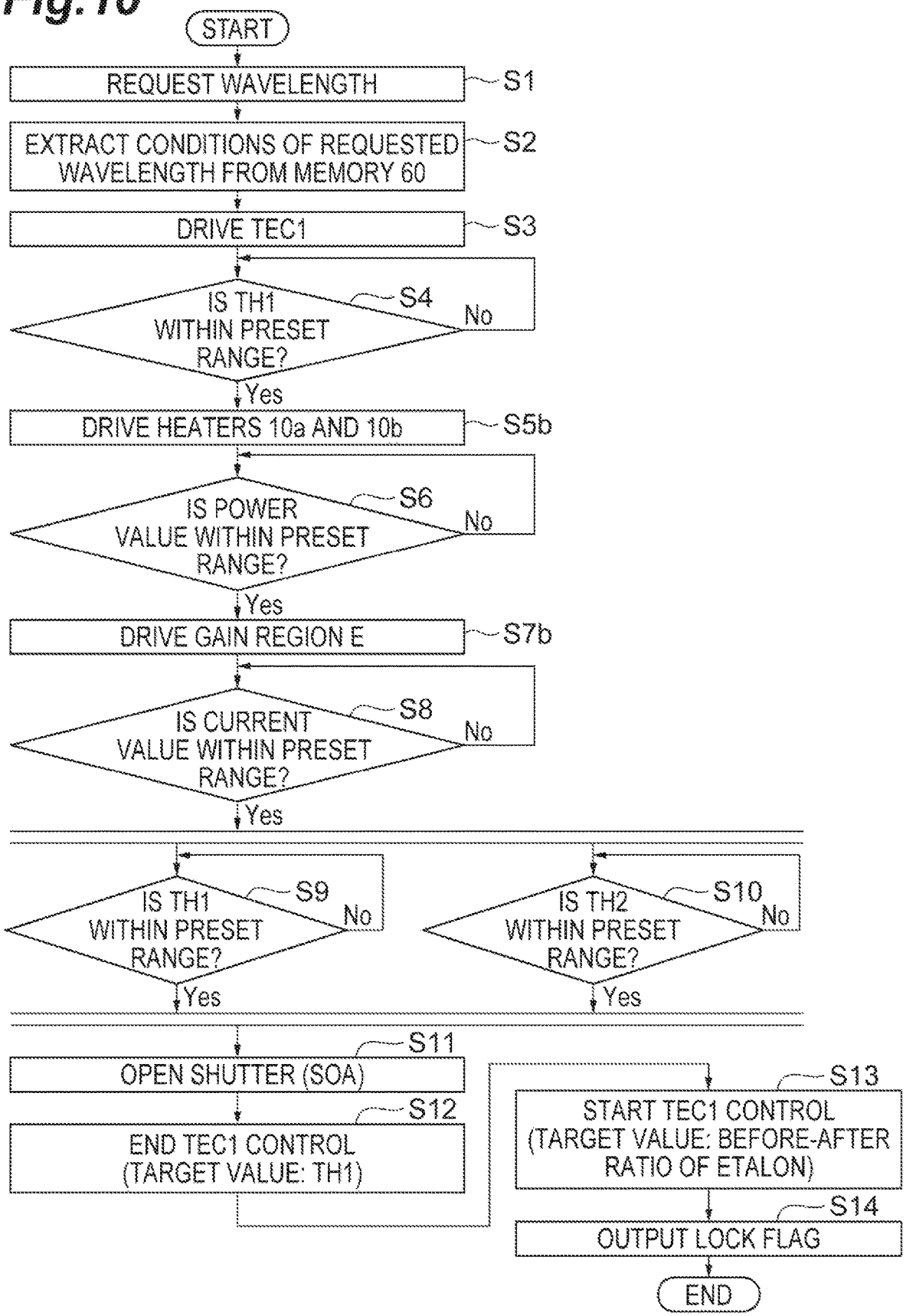

METHOD FOR TUNING EMISSION WAVELENGTH OF LASER DEVICE

CROSS REFERENCE TO RELATED APPLICATIONS

This application claims the priority benefit of Japanese Application No. JP2018-121496 filed on Jun. 27, 2018, the entire contents of which are incorporated herein by references.

TECHNICAL FIELD

The present disclosure relates to a method for tuning emission wavelength of a laser device.

BACKGROUND

A wavelength tunable laser device including a gain function and a wavelength selection function for laser oscillation is known as an optical device (such as that in Japanese Unexamined Patent Publication No. H8-056030). For example, wavelength characteristics of loss, reflection, and gain are varied by varying a refractive index of an optical function region such as a diffraction grating provided in an optical waveguide in a resonator, and an oscillation wavelength is selected.

For selecting the wavelength, the temperature of a semiconductor laser may vary. For example, in a semiconductor laser including a Sampled Grating Distributed Bragg Reflector (SG-DBR) region in which peak wavelengths of a reflectance spectrum are periodically distributed, the temperature of the optical waveguide is varied. The selection of the wavelength is performed based on the variation in refractive index associated with variation in temperature.

However, if a current is injected in a gain region before the temperature falls within a predetermined range, a laser beam with an unintended oscillation wavelength may be output. Accordingly, a method of controlling a wavelength tunable laser device capable of suppressing oscillations at wavelengths other than a desired wavelength is required.

SUMMARY

A method for tuning an emission wavelength of a laser device including: a wavelength tunable laser diode including a gain region, and a first wavelength selection region integrated with a gain region, and a first heater; a first thermo-cooler on which the wavelength tunable laser diode is mounted, the first thermo-cooler being configured to control a temperature of the wavelength tunable laser diode, the method including: acquiring a drive condition of the wavelength tunable laser diode to make the wavelength tunable laser diode oscillate at a wavelength from a memory; driving the first thermo-cooler and the first heater based on the drive condition of the wavelength tunable laser diode; determining whether respective control values of the first thermo-cooler and the first heater are reached within a first range of target values; and driving the gain region after the control values have been reached within the first range.

BRIEF DESCRIPTION OF THE DRAWINGS

The foregoing and other purposes, aspects and advantages will be better understood from the following detailed description of a preferred embodiment of the disclosure with reference to the drawings, in which:

FIG. 3 is a drawing illustrating initial set values and feedback control target values;

FIG. 10 is a flowchart illustrating an example of the control that the controller executes.

DETAILED DESCRIPTION

Figure 1:
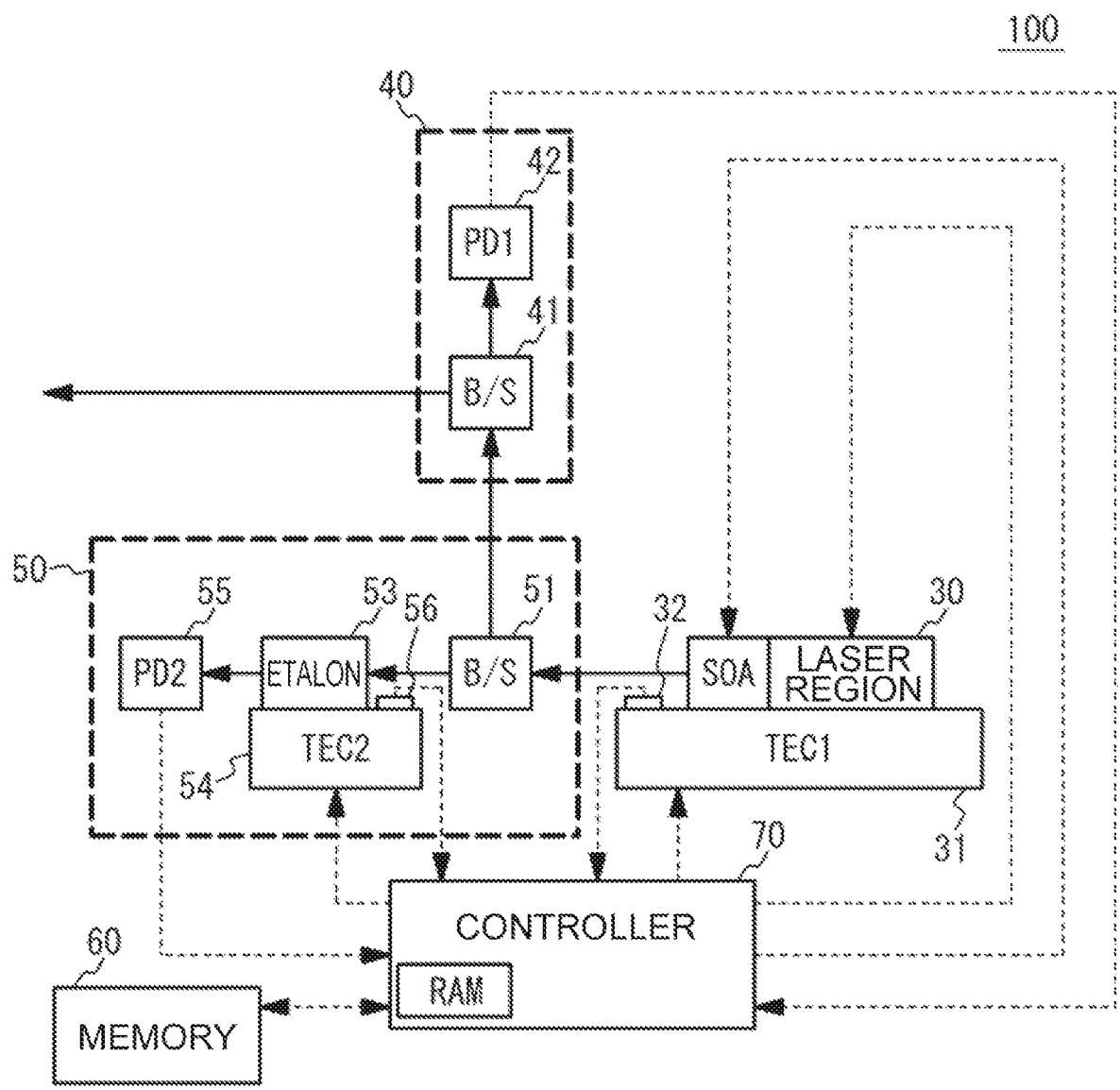
FIG. 1 is a block diagram illustrating a general configuration of a wavelength tunable laser device according to Embodiment 1.

Description of Embodiments of the Present Disclosure

Firstly, contents of an embodiment of the present disclosure will now be listed up for description. One embodiment of the present disclosure is a method of controlling a wavelength tunable laser device including: a wavelength tunable laser including a gain region and a reflecting region optically coupled with the gain region and provided with a first heater; and a thermoelectric cooler including the wavelength tunable laser mounted thereon and configured to control a temperature of the wavelength tunable laser, the method comprising: a step of driving the first heater and the thermoelectric cooler based on a predetermined driving condition; a step of determining whether respective control values of the first heater and the thermoelectric cooler fall within a predetermined range; and a step of driving the gain region after the control values have fallen within the predetermined range.

According to the method of controlling a wavelength tunable laser device described above, with the control values within the predetermined range, the temperatures of the gain region and the reflecting region can fall within an adequate range. By driving the gain region thereafter, the laser oscillation at wavelengths other than the desired wavelength can be suppressed.

One embodiment may be the method wherein the reflecting region is a CSG-DBR including a plurality of the first heaters, and the step of driving the gain region is performed after the control value of the plurality of first heaters has fallen within the predetermined range. By driving the plurality of first heaters, the temperature of the CSG-DBR easily falls within an adequate range. Subsequently, the gain region is activated and thus the laser oscillation at wavelengths other than the desired wavelength can be suppressed.

One embodiment may be the method wherein the reflecting region is an SG-DBR. With the SG-DBR at a temperature within an adequate range, the laser oscillation at wavelengths other than the desired wavelength can be suppressed.

One embodiment may be the method wherein the gain region is an SG-DFB. By driving the thermoelectric cooler, the temperature of the SG-DFB falls within an adequate range. Since the gain region is driven thereafter, the laser oscillation at wavelengths other than the desired wavelength can be suppressed.

One embodiment may be the method wherein the gain region is a TDA-DFB having a second heater, the second heater is driven in the step of driving the first heater and the thermoelectric cooler, and a step of driving the gain region is performed after the control values of the first heater, the second heater, and the thermoelectric cooler have fallen within the predetermined range. By driving the first heater, the second heater, and the thermoelectric cooler, the temperatures of the TDA-DFB and the reflecting region fall within an adequate range. Therefore, the laser oscillation at wavelengths other than the desired wavelength can be suppressed.

One embodiment may be the method wherein the control value of the first heaters is a power value supplied to the first heaters. By driving the gain region after the power value has fallen within a predetermined range, the laser oscillation at wavelengths other than the desired wavelength can be suppressed.

One embodiment may be the method wherein the wavelength tunable laser device further comprises a temperature detection element mounted on the thermoelectric cooler, the control value of the thermoelectric cooler is a power value supplied to the thermoelectric cooler, and the thermoelectric cooler is controlled based on a detection result of the temperature detection element. By driving the gain region after the temperature has fallen within a predetermined range, the laser oscillation at wavelengths other than the desired wavelength can be suppressed.

One embodiment may be the method wherein the control value of the second heater is a power value supplied to the second heater. By driving the gain region after the power value has fallen within a predetermined range, the laser oscillation at wavelengths other than the desired wavelength can be suppressed.

One embodiment may be the method wherein the wavelength tunable laser device further comprises a wavelength locker configured to detect an output wavelength of the wavelength tunable laser, the control value of the thermoelectric cooler is a power value supplied to the thermoelectric cooler, and the thermoelectric cooler is controlled based on a detection result of the wavelength locker. Accordingly, the laser oscillation at wavelengths other than the desired wavelength can be suppressed.

Detailed Description of Embodiments of the Present Disclosure

A specific example of a method of controlling a wavelength tunable laser device according to embodiments of the present disclosure will be described with reference to the drawings below. The present disclosure is not limited to the illustrations but is defined by claims, and is intended to include any modification within the meaning and scope equivalent to the claims.

Embodiment 1

(Wavelength Tunable Laser Device)

FIG. 1 is a block diagram illustrating a general configuration of a wavelength tunable laser device 100 according to Embodiment 1. As illustrated in FIG. 1, the wavelength tunable laser device 100 includes a semiconductor laser 30 (wavelength tunable laser diode) capable of controlling the wavelength as a laser device. The semiconductor laser 30 of the present embodiment is provided with a region which is connected to a laser region to serve as a Semiconductor Optical Amplifier (SOA). The SOA functions as a light output control unit. The SOA may increase or decrease the intensity of a light output as desired. The SOA may control the intensity of the light output to substantially zero. The wavelength tunable laser device 100 includes an output detection unit 40, a wavelength locker 50, a memory 60, a controller 70, and the like. The controller 70 controls the wavelength tunable laser device 100.

(Semiconductor Laser)

Figure 2:
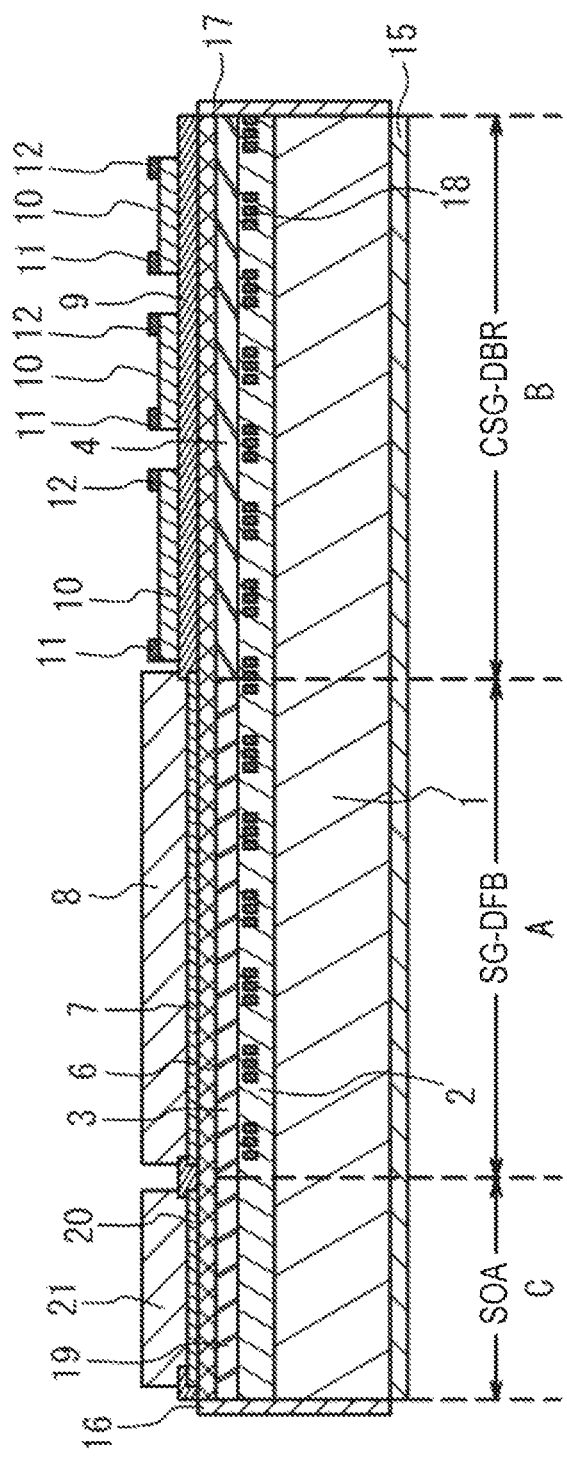
FIG. 2 is a schematic cross sectional-view illustrating a general configuration of a semiconductor laser according to Embodiment 1.

FIG. 2 is a schematic cross-sectional view illustrating a general configuration of the semiconductor laser 30 according to Embodiment 1. As illustrated in FIG. 2, the semiconductor laser 30 includes a partial diffraction grating active region (Sampled Grating Distributed Feedback: SG-DFB) A and a Chirped Sampled Grating Distributed Bragg Reflector (CSG-DBR) region B, and the SOA region C. In other words, the semiconductor laser 30 is a tunable semiconductor laser element having a wavelength selection mirror in a semiconductor structure.

For example, in the semiconductor laser 30, from a front side to a rear side, the SOA region C, the SG-DFB region A, and the CSG-DBR region B are arranged in this order. The SG-DFB region A has a gain and includes a sampled grating. The CSG-DBR region B does not have a gain and includes the sampled grating. The SG-DFB region A and the CSG-DBR region B correspond to the laser region in FIG. 1, and the SOA region C corresponds to the SOA region in FIG. 1.

The SG-DFB region A has a structure in which a lower clad layer 2, an active layer 3, an upper clad layer 6, a contact layer 7, and an electrode 8 are layered on a substrate 1. The CSG-DBR region B has a structure in which the lower clad layer 2, an optical waveguide layer 4, the upper clad layer 6, an insulating film 9, and a plurality of heaters 10 (first heaters) are layered on the substrate 1. Each heater 10 is provided with a power supply electrode 11 and a ground electrode 12. The SOA region C has a structure in which the lower clad layer 2, an optical amplification layer 19, the upper clad layer 6, a contact layer 20, and an electrode 21 are layered on the substrate 1.

In the SG-DFB region A, the CSG-DBR region B, and the SOA region C, the substrate 1, the lower clad layer 2, and the upper clad layer 6 are formed integrally. The active layer 3, the optical waveguide layer 4, and the optical amplification layer 19 are formed on the same plane. A boundary between the SG-DFB region A and the CSGDBR region B corresponds to a boundary between the active layer 3 and the optical waveguide layer 4.

An end face film 16 is formed on end surfaces of the substrate 1, the lower clad layer 2, the optical amplification layer 19 and the upper clad layer 6 on the SOA region C side. In the present embodiment, the end face film 16 is an Anti-Reflection (AR) film. The end face film 16 functions as an end face on the front side of the semiconductor laser 30. An end face film 17 is formed on end surfaces of the substrate 1, the lower clad layer 2, the optical waveguide layer 4, and the upper clad layer 6 on the CSG-DBR region B side. In the present embodiment, the end face film 17 is an AR film. The end face film 17 functions as a rear side end face of the semiconductor laser 30.

Examples of the substrate 1 include a crystal substrate made of n-type InP. Examples of the lower clad layer 2 include n-type InP layer, and examples of the upper clad layer 6 include p-type InP layer. The lower clad layer 2 and the upper clad layer 6 sandwich the active layer 3, the optical waveguide layer 4 and the optical amplification layer 19 from above and below and confine light therein.

The active layer 3 is made of a semiconductor having a gain. The active layer 3 has, for example, a quantum well structure, and has a structure in which well layers made, for example, of $Ga_{0.32}In_{0.68}As_{0.92}P_{0.08}$ (thickness of 5 nm) and barrier layers made of $Ga_{0.22}In_{0.78}As_{0.47}P_{0.53}$ (thickness of 10 nm) layered alternately. The optical waveguide layer 4 may be made, for example, of a bulk semiconductor layer, which is made, for example, of $Ga_{0.22}In_{0.78}As_{0.47}P_{0.53}$. In the present embodiment, the optical waveguide layer 4 has a larger energy gap than the active layer 3.

The optical amplification layer 19 is a region where light is amplified by being provided with a gain through a current injection from the electrode 21. The optical amplification layer 19 may have, for example, a quantum well structure, and may have a structure in which well layers made, for example, of $Ga_{0.35}In_{0.65}As_{0.99}P_{0.01}$ (thickness of 5 nm) and barrier layers made of $Ga_{0.15}In_{0.85}As_{0.32}P_{0.68}$ (thickness of 10 nm) laminated alternately. Alternatively, a bulk semiconductor made, for example, of $Ga_{0.44}In_{0.56}As_{0.95}P_{0.05}$ may be employed as another structure. The optical amplification layer 19 and the active layer 3 may be made of the same material.

The contact layers 7 and 20 may be made, for example, of $Ga_{0.47}In_{0.53}As$ crystal having p-type conductivity. The insulating film 9 is a protective film made of silicon nitride film (SiN) or silicon oxide film (SiO). The heater 10 is a thin-film resistor made of titanium tungsten (TiW). Each heater 10 may be formed across a plurality of segments in the CSG-DBR region B.

The electrodes 8 and 21, the power supply electrode 11, and the ground electrode 12 are made of a conductive material such as gold (Au). A back electrode 15 is formed on a lower side of the substrate 1. The back electrode 15 is formed across the SG-DFB region A, the CSG-DBR region B, and the SOA region C.

The end face film 16 and the end face film 17 are each an AR film having a reflectivity of 1.0% or lower, and have a characteristic of providing end faces of the semiconductor laser 30 with substantially anti reflection property. The AR film may be made of a dielectric film composed, for example, of $MgF_2$ and TiON. It should be noted that both ends of the laser element in the present embodiment are each provided with the AR film, but the films are not limited thereto. For example, the end face film 17 may be a reflective film having a significant reflectivity. In a case where a structure in which the semiconductor in contact with the end face film 17 in FIG. 2 is provided with a light absorption layer is employed, a light output leaking from the end face film 17 to the outside may be suppressed by providing the end face film 17 with significant reflectivity. The significant reflectivity is, for example, 10% or higher. As used herein the term reflectivity indicates reflectivity of light generated in the interior of the semiconductor laser 30.

Diffraction gratings (corrugation) 18 are formed at a plurality of positions apart from each other by a predetermined distance in the lower clad layer 2 in the SG-DFB region A and the CSG-DBR region B. Accordingly, sampled gratings are formed in the SG-DFB region A and the CSG-DBR region B. In the SG-DFB region A and the CSG-DBR region B, a plurality of segments are provided on the lower clad layer 2. As used herein the term segment means a region in which one each of a diffraction grating part provided with the diffraction grating 18 and a space part not provided with the diffraction grating 18 are connected. In other words, the segment corresponds to a region including the space part which is sandwiched by the diffraction grating parts at both ends, and the diffraction grating part connected to each other. The diffraction grating 18 is made of a material with a refractive index different from that of the lower clad layer 2. When the lower clad layer 2 is made of InP, a material of $Ga_{0.22}In_{0.78}As_{0.47}P_{0.53}$ may be used for the diffraction grating.

The diffraction grating 18 may be formed by patterning using a two-beam interference exposure method. The space parts located between the diffraction gratings 18 are achieved by an exposure of a resist with a pattern of the diffraction gratings 18 followed by another exposure of positions corresponding to the space parts. A pitch of the diffraction gratings 18 in the SG-DFB region A and a pitch of the diffraction gratings 18 in the CSG-DBR region B may be the same and may be different. In the present embodiment, the both pitches are set to be the same as an example. In each segment, the diffraction gratings 18 may have the same length and may have different lengths. Alternatively, such a configuration is also applicable that the respective diffraction gratings 18 in the SG-DFB region A have the same length, the respective diffraction gratings 18 in the CSG-DBR region B have the same length, and the lengths of the diffraction gratings 18 are different between the SG-DFB region A and the CSG-DBR region B.

In the SG-DFB region A, optical lengths of the respective segments are substantially the same. In the CSG-DBR region B, the optical lengths of at least two segments are different from each other. Accordingly, the intensity of the peak of the wavelength characteristic in the CSG-DBR region B depends on the wavelength. An average optical length of the segments in the SG-DFB region A is different from an average optical length of the segments in the CSG-DBR region B. In this manner, the segments in the SG-DFB region A and the segments in the CSG-DBR region B constitute a laser region (resonator) in the semiconductor laser 30.

In the interior of each of the SG-DFB region A and the CSG-DBR region B, reflected lights interfere with each other. Since the active layer 3 is provided in the SG-DFB region A, when a carrier is injected into the active layer 3, a discrete gain spectrum having a predetermined wavelength spacing and substantially aligned peak intensity is formed. In the CSG-DBR region B, a discrete reflectance spectrum having a predetermined wavelength spacing and different peak intensities is formed. The spacing of the peak wavelength of the wavelength characteristic in the SG-DFB region A is different from that in the CSG-DBR region B. By utilizing a Vernier effect appearing by a combination of these wavelength characteristics, a wavelength satisfying an oscillation condition may be selected.

As illustrated in FIG. 1, the semiconductor laser 30 may be disposed on a first temperature control device 31. The first temperature control device 31 (thermoelectric cooler) includes a Peltier element and functions as Thermoelectric Cooler (TEC). A first thermistor 32 is disposed on the first temperature control device 31. The first thermistor 32 detects the temperature of the first temperature control device 31. Based on the detected temperature of the first thermistor 32, the temperature of the semiconductor laser 30 may be determined.

The wavelength tunable laser device 100 illustrated in FIG. 1 is of a front locker type, and thus the output detection unit 40 and the wavelength locker 50 are arranged on the front side of the semiconductor laser 30. The wavelength tunable laser device 100 of a rear locker type in which the wavelength locker 50 is disposed on the rear side of the semiconductor laser 30 is also applicable.

The output detection unit 40 includes a beam splitter 41 and a first light receiving element 42. The wavelength locker 50 includes a beam splitter 51, an etalon 53, a second temperature control device 54, a second light receiving element 55, and a second thermistor 56.

The beam splitter 51 is disposed at a position for splitting the output light from the front side of the semiconductor laser 30. The beam splitter 41 is disposed at a position for further splitting one of the rays of light split by the beam splitter 51. The first light receiving element 42 is disposed at a position for receiving one of the rays of light split by the beam splitter 41.

The etalon 53 has a characteristic where transmittance varies periodically in accordance with the wavelength of the incident light. In the present embodiment, a solid etalon is used as the etalon 53. The periodic wavelength characteristic of the solid etalon varies with variation of the temperature. The etalon 53 is disposed at a position for transmitting the other of rays of light split by the beam splitter 51. The etalon 53 is disposed on the second temperature control device 54. The second temperature control device 54 includes a Peltier element and functions as a TEC.

The second light receiving element 55 is disposed at a position for receiving a transmitted light that has passed through the etalon 53. In other words, light that does not have passed through the etalon 53 is received by the first light receiving element 42, and the ray of light that has passed through the etalon 53 is received by the second light receiving element 55. The second thermistor 56 is provided for determining the temperature of the etalon 53. The second thermistor 56 is disposed for example on the second temperature control device 54. In the present embodiment, the temperature of the etalon 53 is determined by detecting the temperature of the second temperature control device 54 by the second thermistor 56. It should be noted that the temperature of the etalon 53 needs only to be within a certain temperature range, and may be disposed on the first temperature control device 31.

The memory 60 is a rewritable storage device. Examples of the rewritable storage device typically include a flash memory. The controller 70 includes a Central Processing Unit (CPU), a Random Access Memory (RAM), a power supply, and the like. The RAM is a memory configured to temporarily store program that the Central Processing Unit executes, data that the central Processing Unit processes, and the like.

The memory 60 stores initial set values and feedback control target values of respective parts of the wavelength tunable laser device 100 in association with respective channels. The channels described below in conjunction with FIG. 3 are numbers corresponding to respective oscillation wavelengths of the semiconductor laser 30. For example, each channel corresponds to a grit wavelength specified in International Telecommunication Union Telecommunication Standardization Sector (ITU-T).

(Laser Oscillation)

FIG. 3 is a drawing illustrating initial set values and feedback control target values. As illustrated in FIG. 3, the aforementioned initial set values include an initial current value $I_{LD}$ supplied to the electrode 8 in the SG-DFB region A, an initial current value $I_{SOA}$ supplied to the electrode 21 of the SOA region C, an initial temperature value $T_{LD}$ of the semiconductor laser 30, an initial temperature value $T_{Etalon}$ of the etalon 53, and initial power values $P_{Heater1}$ to $P_{Heater3}$ supplied to the respective heaters 10. Such an initial set values are determined by channels corresponding to the oscillation wavelengths. The aforementioned feedback control target values are target values when performing feedback control of the controller 70. The feedback control target value includes a target value $I_{m1}$ of a photocurrent that the first light receiving element 42 outputs and a target value $I_{m2}/I_{m1}$, which is a ratio between photocurrents $I_2$ and $I_1$ that the second light receiving element 55 outputs. The control target value is also determined for each channel. It should be noted that these values are acquired for each individual body through tuning using a wavelength meter before shipping of the wavelength tunable laser device 100.

Subsequently, an operation of the wavelength tunable laser device 100 for outputting any one of grit wavelengths will be described with reference to FIG. 1 to FIG. 3. First of all, the controller 70 acquires information about a requested channel from outside. The controller 70 acquires an initial set value and a feedback control target value corresponding to the requested channel from the memory 60 based on the information about the requested channel, and reads out the values to the RAM integrated therein. The controller 70 supplies an electric current in accordance with the initial current value $I_{LD}$ corresponding to the channel to the electrode 8 of the semiconductor laser 30.

The controller 70 supplies power to the first temperature control device 31 so as to achieve the initial temperature value $T_{LD}$ corresponding to the channel. This makes the temperature of the semiconductor laser 30 controlled to the initial value. The controller 70 supplies powers at the initial power values $P_{Heater1}$ to $P_{Heater3}$ corresponding to the channels to the respective heaters 10. This allows the respective heaters 10 to generate heat at the predetermined temperatures, respectively. The temperature of each segment in the CSG-DBR region B is controlled by the control of the powers to be supplied to the heaters 10 to vary equivalent refractive indexes of the respective segments. This varies the reflecting characteristics of the segments.

By the temperature control by the first temperature control device 31 and the temperature control by the respective heaters 10, the semiconductor laser 30 is set to the oscillation conditions at a grit wavelength corresponding to the requested channel. The controller 70 also supplies a current with the initial current value $I_{SOA}$ corresponding to the channel to the electrode 21 of the SOA region C. This allows the light intensity of the laser beam output from the front of the semiconductor laser 30 to be controlled to the initial value. The semiconductor laser 30 performs laser oscillation based on the respective initial values set in this manner. However, in this state, conformity with the selected grid wavelength, or achievement of predetermined output light intensity is not necessarily guaranteed. Therefore, a feedback control of the wavelength and the output light intensity is performed. It should be noted that even when the requested wavelength is not the grid wavelength, the controller 70 is capable of obtaining the set value of the requested wavelength (gridless wavelength) by calculating from the initial set value corresponding to the channel (grid wavelength). Even when the requested wavelength is not the grid wavelength in this manner, oscillation at the requested wavelength is achieved. Also, the channel does not have to be the grid wavelength. The channel itself may be set to the gridless wavelength.

For such feedback control, the controller 70 performs Auto Power Control (APC) and Auto Frequency Control (AFC). Specifically, the controller 70 performs feedback control as the Auto Power Control on the current $I_{SOA}$ to be supplied to the electrode 21 of the SOA region C so that a photocurrent value that the first light receiving element 42 outputs becomes a target value $I_{m1}$ corresponding to the channel. This allows the output light intensity of the semiconductor laser 30 to be controlled to the desired value corresponding to the channel. The controller 70 also controls the temperature of the semiconductor laser 30 as the Auto Frequency Control so that the ratio $I_2/I_1$ of the photocurrent $I_2$ output from the second light receiving element 55 with respect to the photocurrent $I_1$ becomes the target value $I_{m2}/I_{m1}$. This allows the output optical wavelength of the semiconductor laser 30 is controlled to a wavelength corresponding to the channel. Specifically, control of the temperature of the semiconductor laser 30 is achieved by supplying power to the first temperature control device 31 and controlling the temperature of the first temperature control device 31. The control of the temperature of the semiconductor laser 30 is achieved by controlling the heater mounted on the semiconductor laser 30 and the first temperature control device 31.

It should be noted that the controller 70 controls a drive power of the second temperature control device 54 so as to achieve the initial temperature value $T_{Etalon}$ corresponding to the channel. The power to be supplied to the second temperature control device 54 is subject to feedback control based on the detection result of the second thermistor 56, so that the temperature of the etalon 53 is controlled to a predetermined value. With the control described above, the semiconductor laser 30 is allowed to oscillate laser at a desired wavelength. It should be noted that the temperature of the etalon 53 needs only to be within a certain temperature range, and may be disposed on the first temperature control device 31.

(Spectrum)

Figure 4A:
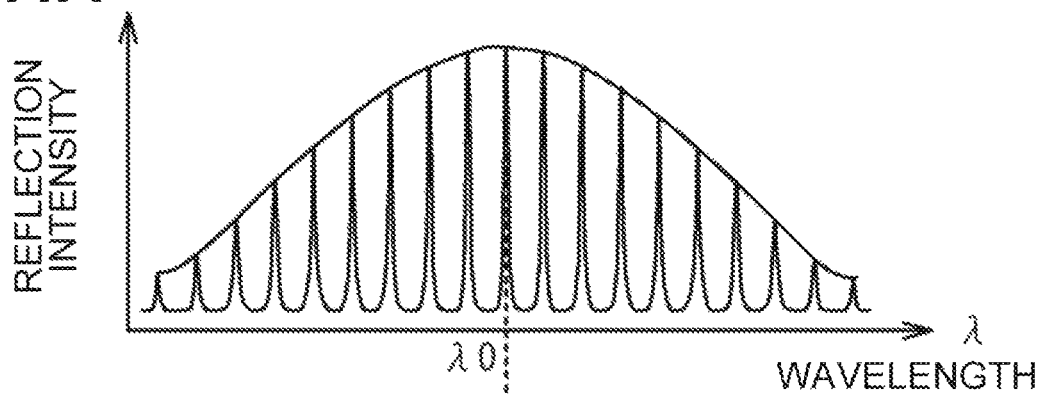
FIG. 4A is a drawing illustrating a reflectance spectrum in CSG-DBR region B.

FIG. 4A is a drawing illustrating a reflectance spectrum of the CSG-DBR region B. The reflectance spectrum of the CSG-DBR region B is obtained by overlapping the reflectance spectrum of each segment. Since the plurality of segments have different optical lengths from each other, peak periods of the reflectance spectra of the segments are different from each other. By overlapping the reflectance spectra each other, a bell-shaped (mountain-shaped) envelope curve of intensities different in reflection intensity by wavelengths is formed as illustrated in FIG. 4A. When further expanding the range of wavelengths, an envelope curve of a form of a plurality of bells arranged in a line is formed. In this manner, wavelength dependency appears in reflection intensity in the CSG-DBR region B.

Figure 4B:
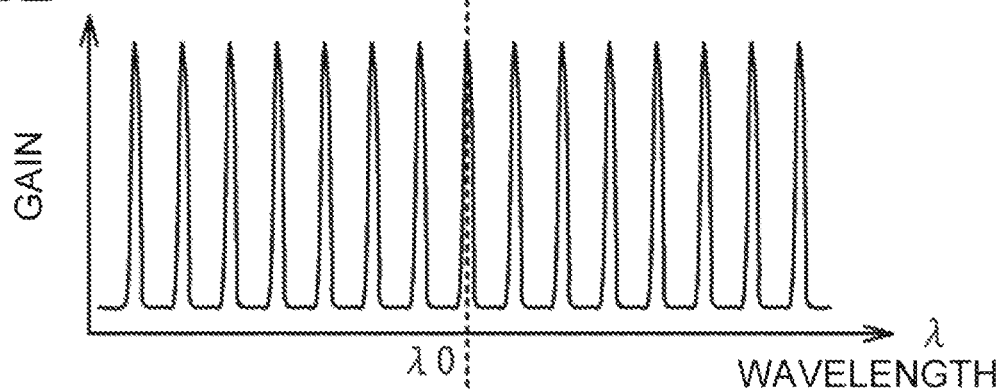
FIG. 4B is a drawing illustrating a gain spectrum in SG-DFB region A.

FIG. 4B is a drawing illustrating a gain spectrum in the SG-DFB region A. In the SG-DFB region A, the optical lengths of the respective segments are substantially the same, and the temperatures of the respective segments are controlled to be constant by the first temperature control device 31. Therefore, the intensities of the peak wavelengths are almost the same.

Figure 4C:
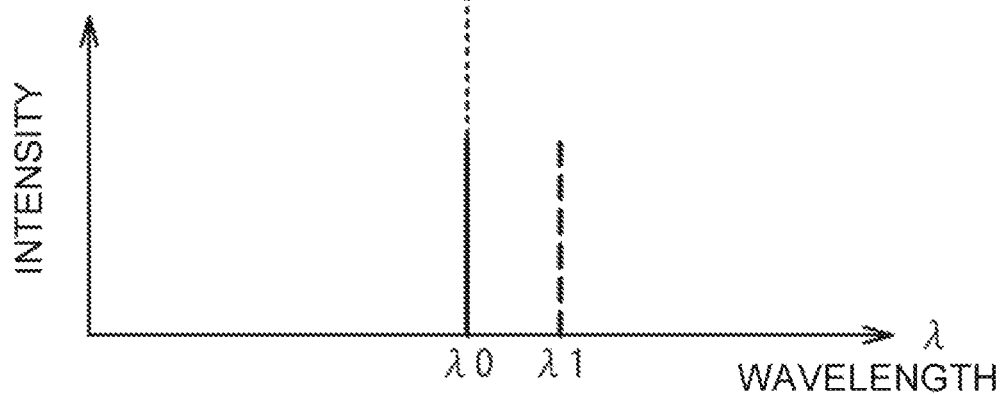
FIG. 4C is a drawing illustrating an oscillation wavelength of the semiconductor laser.

FIG. 4C is a drawing illustrating the oscillation wavelength of the semiconductor laser 30. In the semiconductor laser 30 according to the present embodiment, laser oscillation occurs at a wavelength λ0 as indicated by a solid line in FIG. 4C. The wavelength λ0 is a wavelength at which the wavelength with a higher reflection intensity in the reflectance spectra in the CSG-DBR region B matches any one of wavelength in the gain spectra of the SG-DFB region A.

Therefore, by varying the wavelength-reflection intensity characteristics in the CSG-DBR region B, the laser oscillation wavelength may be selected. In other words, as described above, the temperature of the semiconductor laser 30 is controlled within a desired range by driving the plurality of heaters 10 and the first temperature control device 31 in the CSG-DBR region B, so that the laser oscillation wavelength may be brought to the wavelength λ0.

However, when the temperature cannot be controlled within a desired range, the laser oscillation wavelength often differs from the desired wavelength λ0 due to variation in wavelength-reflection intensity characteristics in CSG-DBR region B or the like. When driving the SG-DFB region A in this state, light at a wavelength λ1, which is not intended, is output from the semiconductor laser 30. In particular, since the set values of the plurality of heaters 10 and the first temperature control device 31 are different, it takes time for those to reach target set values. Therefore, the temperature of the semiconductor laser 30 may not be stabilized. In this case, oscillation at wavelengths other than λ0 may often occur. An example of control for suppressing the oscillation at wavelengths other than the desired wavelength will be described below.

(Control)

Figure 5:
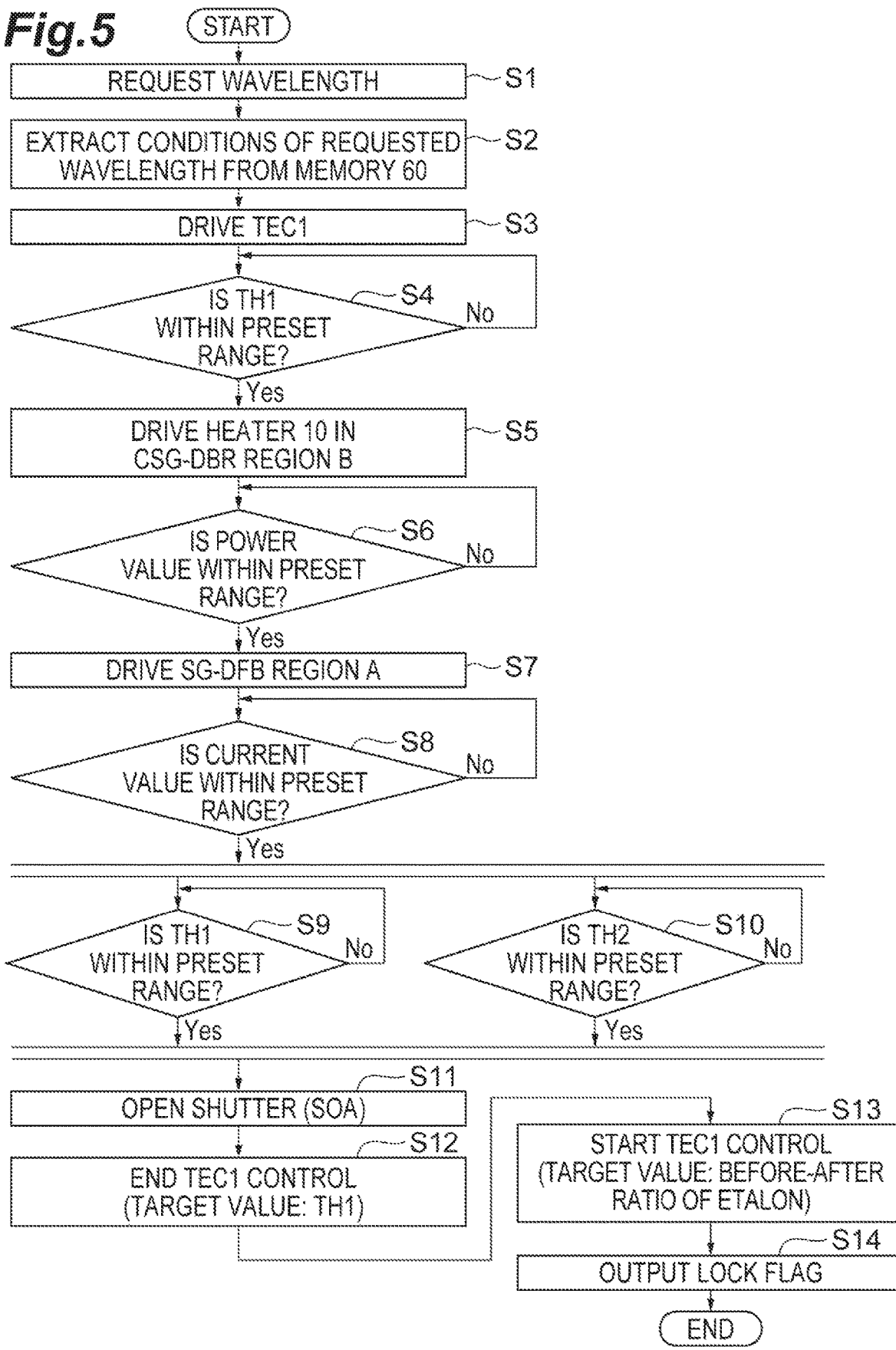
FIG. 5 is a flowchart illustrating an example of control that a controller executes.

FIG. 5 is a flowchart illustrating an example of the control that the controller 70 executes. As illustrated in FIG. 5, the controller 70 receives a wavelength request (Step S1). This wavelength request is based on an input from an exterior input/output device, not illustrated. The wavelength that is requested (requested wavelength) is a wavelength corresponding to any one of channels in FIG. 3.

The controller 70 extracts conditions for control corresponding to the requested wavelength from the memory 60 (Step S2). The controller 70 acquires the initial set value and the feedback control target value corresponding to the requested wavelength from the memory 60 and stores the same in the RAM.

Next, the controller 70 drives the first temperature control device 31 (TEC1) (Step S3). The controller 70 injects, for example, a current under the control conditions illustrated in FIG. 3 to the first temperature control device 31. The controller 70 determines whether or not the detection temperature TH1 of the first thermistor 32 is within the range of $T_{LD}$ (Step S4). The range of TH1 is a predetermined range centered on the target temperature $T_{LD}$ and, for example, is on the order of $T_{LD}\pm 0.1°$ C. When it is determined to be "No" in Step S4, the controller 70 changes a current value to be supplied to the first temperature control device 31 so that the detection temperature TH1 of the first thermistor 32 falls within the predetermined range.

When it is determined to be "Yes" in Step S4, the controller 70 drives the heaters 10 of CSG-DBR region B (Step S5). For example, the power based on the control conditions illustrated in FIG. 3 is injected into the respective heaters 10. The controller 70 determines whether or not the power values supplied to the heaters 10 are within a preset range (Step S6). The preset range of the power value is a predetermined range centered on the power value of the control condition, and for example, a range such as $P_{Heater1}\pm 0.05$ mW. From the start of control to Step S6, a current is not injected into the electrode 8 of the SG-DFB region A, and the semiconductor laser 30 is not driven.

Next, the controller 70 drives the SG-DFB region A by injecting a current to the electrode 8 based on the initial set value and the feedback control target value specified in Step S4 (Step S7). Accordingly, the semiconductor laser 30 is oscillated. The controller 70 determines whether or not the current value injected into the SG-DFB region A falls within the preset range (Step S8). The preset range of the current value is a predetermined range centered on the current value $I_{LD}$ of the control condition and is, for example, $I_{LD} \pm 0.1$ mA. At this time, the controller 70 drives the semiconductor laser 30 by using the initial set value of the requested wavelength selected in Step S2. The temperature of the etalon 53 is controlled to a preset temperature $T_{Etalon}$ calculated in Step S3 by driving at a power supplied to the second temperature control device 54. In the SOA region C, light is controlled not to be output from the semiconductor laser 30 at this time point.

Next, the controller 70 determines whether or not the detection temperature TH1 of the first thermistor 32 is within the range of $T_{LD}$ (Step S9). The range of the $T_{LD}$ here is the predetermined range centered on the target temperature $T_{LD}$. The $T_{LD}$ is narrower than the range of the step S4, and is, for example, on the order of $T_{LD} \pm 0.05°$ C. When it is determined to be "No" in Step S9, the controller 70 changes a current value to be supplied to the first temperature control device 31 so that the detection temperature TH1 of the first thermistor 32 approaches the initial temperature value $T_{LD}$.

The controller 70 determines whether or not the detection temperature TH2 of the second thermistor 56 is within the preset range in parallel to Step S9 (Step S10). The preset range in this case is determined based on the preset temperature $T_{Etalon}$, and, for example, may be a predetermined range centered on the preset temperature $T_{Etalon}$. When it is determined to be "No" in Step S10, the controller 70 changes a current value to be supplied to the second temperature control device 54 so that the detection temperature TH2 of the second thermistor 56 approaches the preset temperature $T_{Etalon}$.

The controller 70 waits until it is determined to be "Yes" both in Step S9 and Step S10. When it is determined to be "Yes" both in Step S9 and Step S10, the controller 70 performs an action of opening a shutter (Step S11). Specifically, the current to be supplied to the electrode 21 in the SOA region C is controlled to be the initial current value $I_{SOA}$. This makes the laser beam at the requested wavelength output from the semiconductor laser 30. It should be noted that after the action of opening the shutter described above, the drive current in the SOA region C is subjected to feedback control so that the $I_{SOA}$ is maintained at a predetermined value based on the detection result of the output detection unit 40. The controller 70 terminates the temperature control having $T_{LD}$ as the control target by the first temperature control device 31 (Step S12).

Next, the controller 70 starts automatic wavelength control by the first temperature control device 31. (Step S13). In other words, the feedback control is performed so that the temperature of the first temperature control device 31 satisfies the ratio $I_{m2}/I_{m1}$. The ratio between input light and output light (ratio between before and after) of the etalon 53 indicates the oscillation wavelength of the semiconductor laser 30. The first temperature control device 31 is a parameter for controlling the wavelength of the semiconductor laser 30. In other words, in Step S9, the wavelength of the semiconductor laser 30 is controlled by performing feedback control of the temperature of the first temperature control device 31 so that the ratio between before and after becomes $I_{m2}/I_{m1}$. The control of the current value supplied to the first temperature control device 31 is executed based on a predetermined increment value (fixed value). The controller 70 generates a temperature control sign for bringing the ratio $I_2/I_1$ closer to the target value $I_{m2}/I_{m1}$. The temperature control sign includes a sign indicating the temperature rise, a sign indicating drop of temperature, and a sign used when the temperature change is unnecessary. Based on these signs, control for increasing or reducing the current value to be supplied to the first temperature control device 31 by the increment value is performed. Alternatively, when the ratio $I_2/I_1$ is shifted to the predetermined range with respect to the target value $I_{m2}/I_{m1}$, a sign indicating that the temperature control is unnecessary is output from the controller 70, and the amount of current of the first temperature control device 31 is not changed.

The controller 70 outputs a lock flag when the fact that the ratio $I_2/I_1$ is within the predetermined range centered on the target value $I_{m2}/I_{m1}$ of the requested wavelength selected in Step S2 is confirmed (Step S14). It should be noted that in order to achieve a requested wavelength different from the one described above after activation of the semiconductor laser 30, an action of closing the shutter is firstly performed by controlling the SOA region C. Subsequently, an activation action may be performed from the above-described Step S1.

According to Embodiment 1, the first temperature control device 31 and the heaters 10 are driven, and after the temperature TH1 has fallen within the predetermined range and the power value has fallen within the predetermined value, the SG-DFB region A is driven. In other words, after the temperatures in the SG-DFB region A and the CSG-DBR region B have fallen within adequate ranges, the SG-DFB region A is driven. In contrast, when the temperature TH1 and the power value are out of the predetermined range, the SG-DFB region A is not driven. Therefore, laser oscillation at wavelengths other than the predetermined wavelength is suppressed, and the wavelength tunable laser device 100 oscillates at a desired wavelength such as λ0 in FIG. 4C.

The reflecting region of the semiconductor laser is the CSG-DBR region B, and includes a plurality of the heaters 10. As illustrated in FIG. 3, the initial set values of the power value may be different by the heater 10 for selecting the wavelength. Therefore, it takes time until the power values of all the heaters 10 fall within the predetermined range, and the temperature is stabilized. In particular, it takes time until the temperature of the heaters 10 of which the temperature variation width is large is stabilized. If a current is injected into the SG-DFB region A during this period, the laser oscillation may start at an unintended wavelength. In the present embodiment, the SG-DFB region A is driven only after the power values of all the heaters 10 have fallen within the predetermined range. Therefore, of the reflectance spectra in an envelope curve illustrated in FIG. 4A, the wavelength of high intensity may be set to the desired wavelength λ0. Consequently, the laser oscillation at wavelengths other than the desired wavelength is suppressed, and the laser oscillation at the desired wavelength is enabled.

The gain region of the semiconductor laser 30 is the SG-DFB region A. Injection of a current to the electrode 8 is performed after the temperature TH1 and the power value fall within the respective predetermined ranges, and the SG-DFB region A is driven. Accordingly, the laser oscillation at wavelengths other than the desired wavelength is suppressed.

Of the temperature control of the first temperature control device 31, the temperature range in Step S4 is $T_{LD} \pm 0.1°$ C., and is larger than the temperature range $T_{LD} \pm 0.05°$ C. in Step S9. By performing Step S4 with larger temperature range quickly, it is possible to shorten the time of control. It should be noted that in Steps S4 and S9, TH1 may be controlled to the same temperature range.

Embodiment 2

In Embodiment 2, as driving of the first temperature control device 31 and driving of the heaters 10 are performed in parallel, description about the same configuration as in Embodiment 1 will be omitted.

Figure 6:
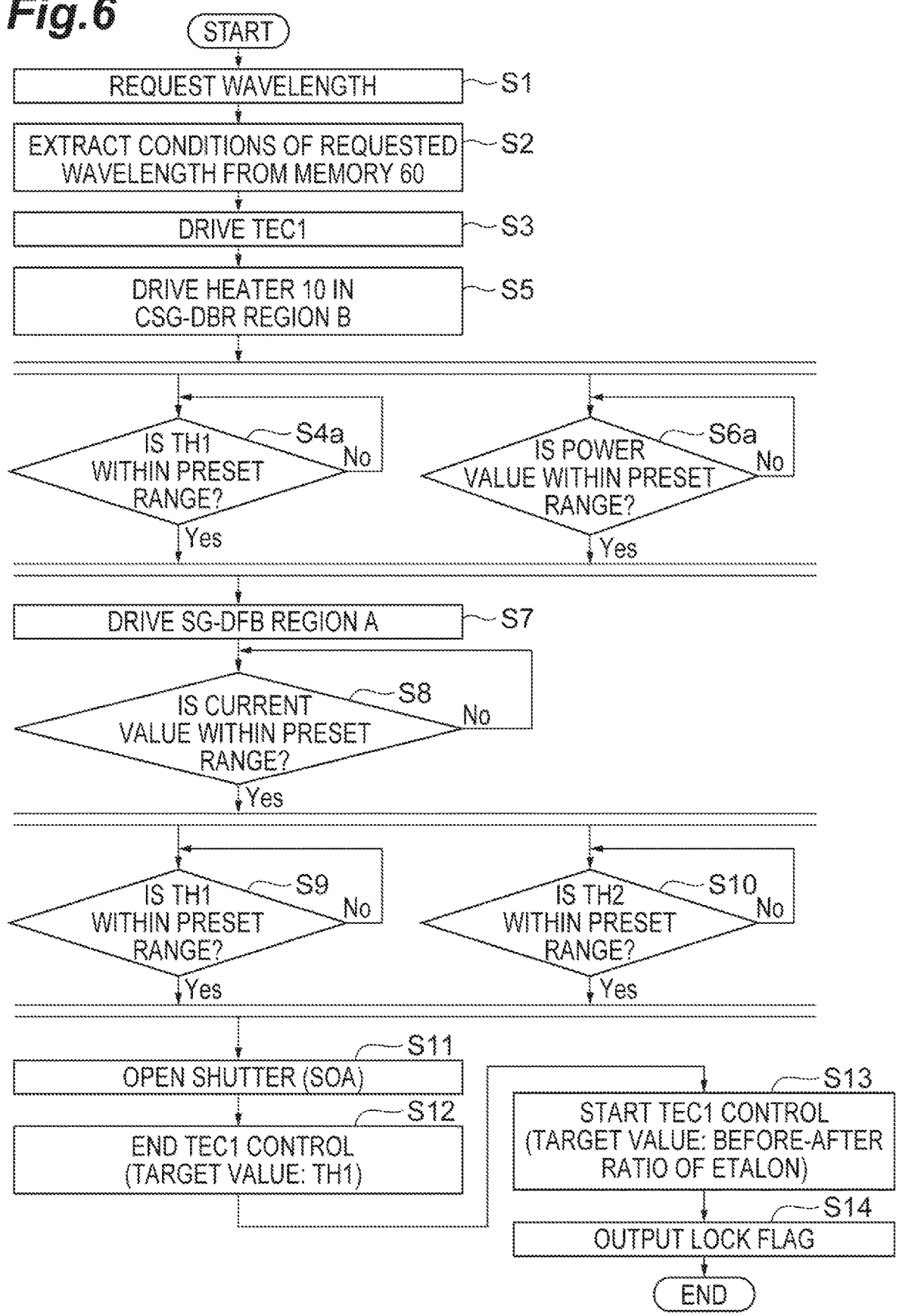
FIG. 6 is a flowchart illustrating an example of the control that the controller executes.

FIG. 6 is a flowchart illustrating an example of the control that the controller 70 executes. As illustrated in FIG. 6, the controller 70 performs Steps S1 to S3 and Step S5. Subsequently, the controller 70 determines whether or not the detection temperature TH1 of the first thermistor 32 is within the range of $T_{LD}$ (Step S4a). In parallel with Step S4a, whether or not the power values to be supplied to the heaters 10 are within the preset range will be determined (Step S6a).

The controller 70 waits until it is determined to be "Yes" both in Step S4a and Step S6a. When it is determined to be "Yes" both in Step S4a and Step S6a, the controller 70 performs Steps S7 to S14.

According to Embodiment 2, the laser oscillation at wavelengths other than the desired wavelength is suppressed in the same manner as in Embodiment 1. In addition, since Step S4a and Step S6a are performed in parallel, faster processing is achieved.

Embodiment 3

Figure 7:
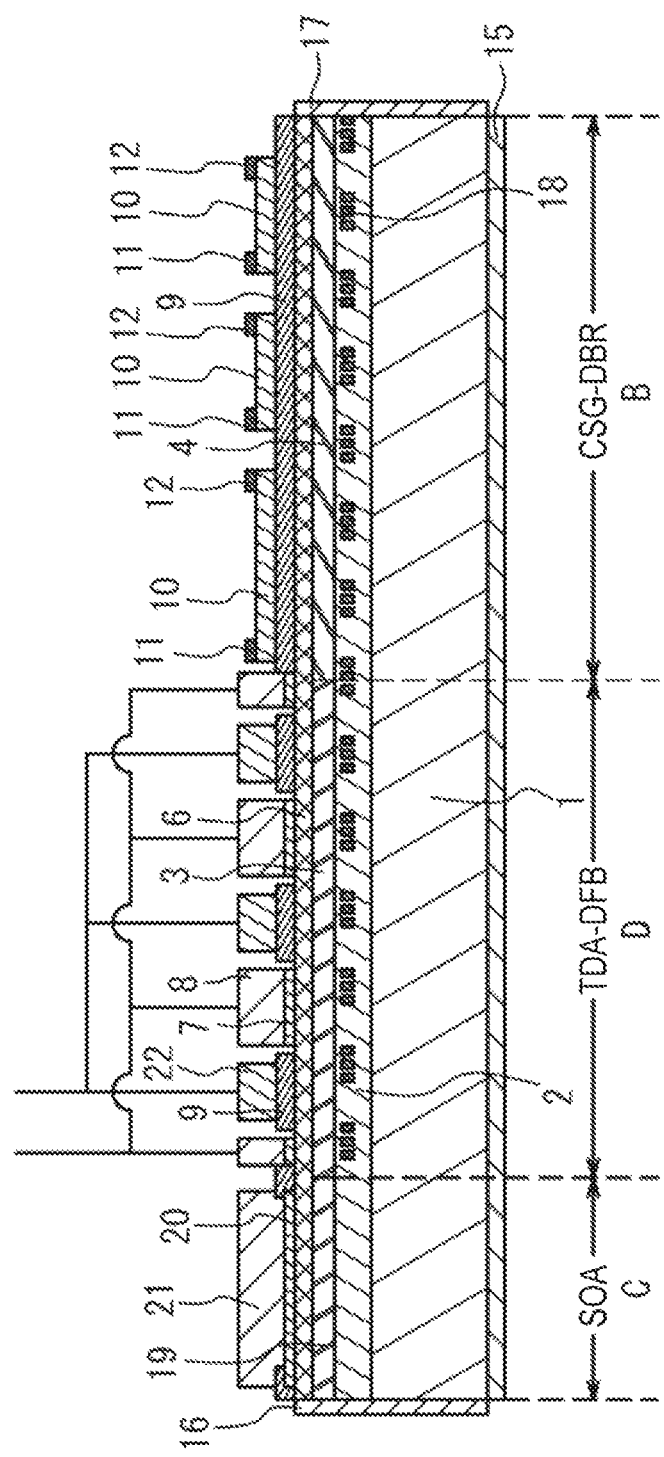
FIG. 7 is a schematic cross-sectional view illustrating a general configuration of a semiconductor laser according to Embodiment 3.

In Embodiment 3, a semiconductor laser 33 having a Tunable Distributed Amplified DFB (TDA-DFB) region is used instead of the semiconductor laser 30. Description about the same configuration as in Embodiment 1 will be omitted. FIG. 7 is a schematic cross-sectional view illustrating a general configuration of the semiconductor laser 33 according to Embodiment 3. As illustrated in FIG. 7, the semiconductor laser 33 includes a TDA-DFB region D, the CSG-DBR region B, and the SOA region C. From a front side to a rear side, the SOA region C, the TDA-DFB region D, and the CSG-DBR region B are arranged in this order.

The TDA-DFB region D has a structure in which the lower clad layer 2, the active layer 3, and the upper clad layer 6 are layered on the substrate 1. On the upper clad layer 6, a plurality of regions in which the contact layer 7 and the electrode 8 are layered and a plurality of regions in which the heater 22 (second heater) is layered on the insulating film 9 are provided. The heater 22 is provided with a power supply electrode and a ground electrode, not illustrated. The electrode 8 and the heater 22 are connected to drive source different from each other, and are supplied with power independently.

Figure 8:
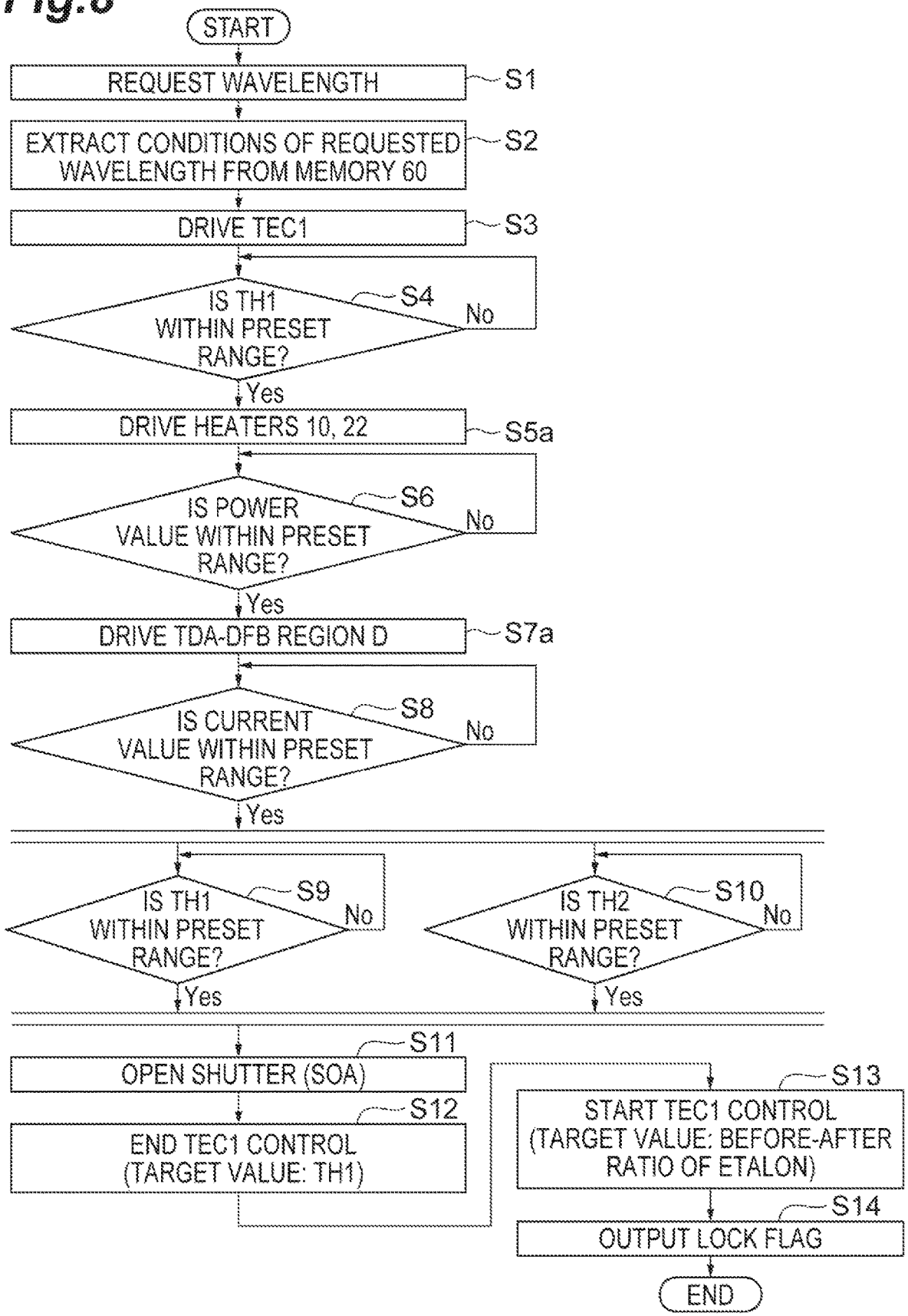
FIG. 8 is a flowchart illustrating an example of the control that the controller executes.

FIG. 8 is a flowchart illustrating an example of the control that the controller 70 executes. As illustrated in FIG. 8, the controller 70 performs Steps S1 to S4. Subsequently, the controller 70 drives the heaters 10 in the CSG-DBR region B and the heater 22 in the TDA-DFB region D (Step S5a). The controller 70 determines whether or not the power values supplied to the heaters 10 and 22 are within a preset range (Step S6).

When it is determined to be "Yes" in Step S6, the controller 70 drives the TDA-DFB region D (Step S7a). Subsequently, the controller 70 performs Steps S8 to S14.

The semiconductor laser 33 includes the plurality of heaters 10 in the CSG-DBR region B and the plurality of heater 22 in the TDA-DFB region D. According to Embodiment 3, the heaters 10 and 22 are driven before driving the TDA-DFB region D, and the power value is within the preset range. Therefore, in the same manner as Embodiments 1 and 2, the laser oscillation at wavelengths other than the desired wavelength is suppressed.

It should be noted that it is also possible that Embodiment 3 and Embodiment 2 are combined and the controller 70 determines whether or not the respective power values of the heaters 10 and 22 fall within the preset range in Step S6a in FIG. 6.

Embodiment 4

Figure 9:
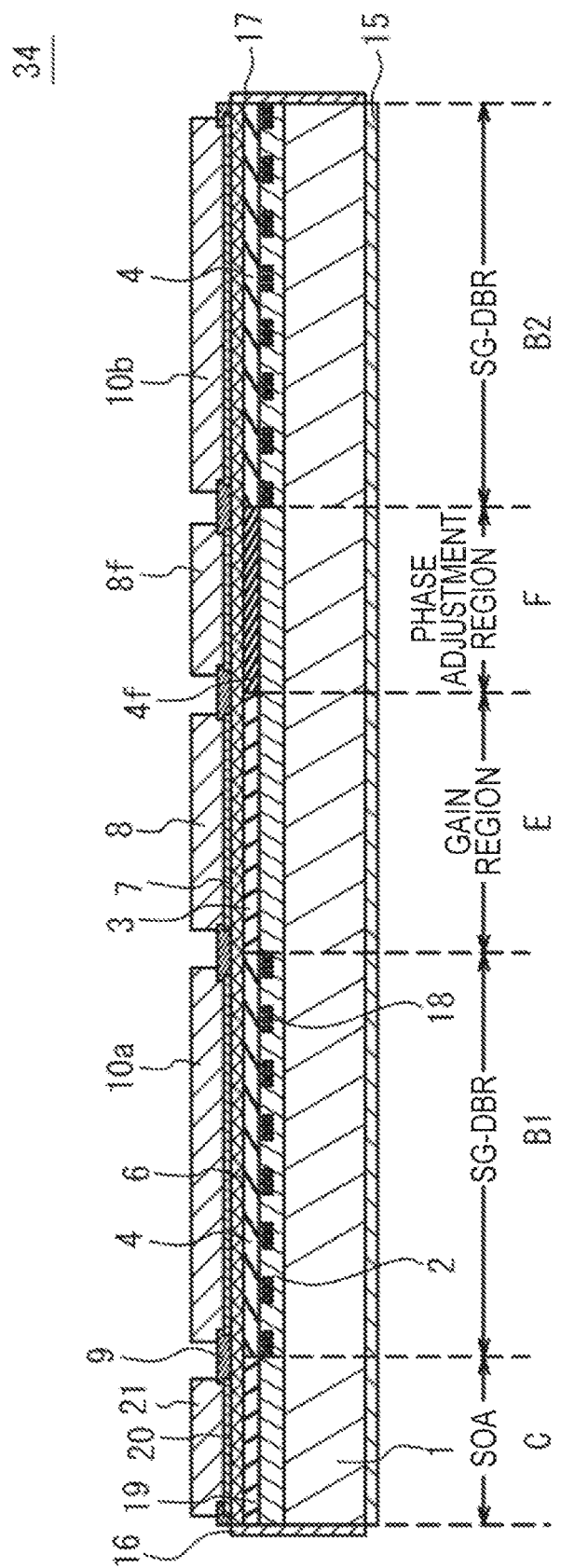
FIG. 9 is a schematic cross-sectional view illustrating a general configuration of a semiconductor laser according to Embodiment 4.

In Embodiment 4, a semiconductor laser 34 is used instead of the semiconductor laser 30. Description about the same configuration as in Embodiment 1 will be omitted. FIG. 9 is a schematic cross sectional-view illustrating a general configuration of the semiconductor laser 34 in Embodiment 4. As illustrated in FIG. 9, the semiconductor laser 34 includes SG-DBR regions B1 and B2, the SOA region C, the gain region E, and a phase adjustment region F. From a front side to a rear side, the SOA region C, the SG-DBR region B1, the gain region E, the phase adjustment region F, and the SG-DBR region B2 are arranged in this order.

The SG-DBR region B1 includes a heater 10a, and the SG-DBR region B2 includes a heater 10b. The gain region E has a structure in which the lower clad layer 2, the active layer 3, the upper clad layer 6, the contact layer 7, and the electrode 8 are layered on the substrate 1. The phase adjustment region F has a structure in which the lower clad layer 2, an optical waveguide layer 4f, the contact layer 7, and an electrode 8f are layered on the substrate 1.

A plurality of segments that constitute the SG-DBR region B1 have substantially the same optical length. A plurality of segments that constitute the SG-DBR region B2 have substantially the same optical length. The optical length of the segments in the SG-DBR region B1 is different from the optical length of the segments in the SG-DBR region B2. Power is supplied to the heater 10a in the SG-DBR region B1 and the heater 10b in the SG-DBR region B2 independently. By the power supply, the peaks of the wavelength characteristics of segments in the two SG-DBR regions B1 and B2 are controlled. The oscillation wavelength is selected at a wavelength at which both peaks match. Further, the gain is controlled by injecting a current to the electrode 8 in the gain region E.

FIG. 10 is a flowchart illustrating an example of the control that the controller 70 executes. As illustrated in FIG. 10, the controller 70 performs Steps S1 to S4. Subsequently, the controller 70 drives the heater 10a in the SG-DBR region B1 and the heater 10b in the SG-DBR region B2 (Step S5b). The controller 70 determines whether or not the power values supplied to the heaters 10a and 10b are within a preset range (Step S6). When it is determined to be "Yes" in Step S6, the controller 70 drives the gain region E (Step S7b). Subsequently, the controller 70 performs Steps S8 to S14.

The semiconductor laser 34 includes the SG-DBR region B1 and the heater 10a in the SG-DBR region B1, and the SG-DBR region B2 and the heater 10b in the SG-DBR region B2. The heaters 10a and 10b have preset values of the power values different from each other, and it takes time until the temperature is stabilized. According to Embodiment 4, the heaters 10a and 10b are driven before driving the gain region E, and the power values are within the preset range. Therefore, in the same manner as Embodiments 1 to 3, the laser oscillation at wavelengths other than the desired wavelength is suppressed.

It should be noted that it is also possible that Embodiment 4 and Embodiment 2 are combined and the controller 70 determines whether or not the respective power values of the heaters 10a and 10b fall within the preset range in Step S6a in FIG. 6.

In Embodiments 1 to 4, the control values of the heater 20 or the heaters 10a and 10b in the reflecting region are power values supplied to the respective heaters. The control value of the first temperature control device 31 is the temperature TH1 of the first temperature control device 31. In Embodiment 3, the control value of the heater 22 in the TDA-DFB region D is the power value. The controller 70 adjusts and brings these control values into the predetermined range. This makes the temperature fall within an adequate range. Subsequently, by driving the gain region, the laser oscillation at wavelengths other than the desired wavelength is suppressed. It should be noted that other parameters may be used as the respective control values. Further, the first temperature control device 31 is TEC including the Peltier element, but devices other than the Peltier element may be used as the first temperature control device. The wavelength tunable laser may oscillate at wavelengths other than the ITU-T grid wavelength.

Embodiment 5

Although not illustrated, by performing the same actions as in Embodiments 1 to 4 for switching the wavelength, the laser oscillation at wavelengths other than the desired wavelength is suppressed in the same manner as in Embodiments 1 to 4. Specifically, after the shutter has been closed, the driving conditions of the wavelength tunable laser are changed to oscillate the laser at a different wavelength. If the heater or the gain region of the TEC or of the wavelength tunable laser is changed in a state in which the wavelength tunable laser is being driven, a laser beam may be output at wavelengths other than the desired wavelength. In contrast, in the present embodiments, by stopping the supply of a current to the gain region of the wavelength tunable laser, the oscillation of the wavelength tunable laser stops. Subsequently, by performing the same action as in Embodiments 1 to 4, the laser oscillation at wavelengths other than the desired wavelength is suppressed.

Although embodiments according to one aspect of the present disclosure have been described in detail, the present disclosure is not limited to the specific embodiments, and various modifications and alterations may be made within the scope of the gist of the present disclosure described in the claims.

What is claimed is:

1. A method for tuning an emission wavelength of a laser device including:
    a wavelength tunable laser diode including a gain region, and a first wavelength selection region integrated with a gain region, and a first heater;
    a first thermo-cooler on which the wavelength tunable laser diode is mounted, the first thermo-cooler being configured to control a temperature of the wavelength tunable laser diode, the method comprising:
    acquiring a first drive condition of the wavelength tunable laser diode to make the wavelength tunable laser diode oscillate at a wavelength from a memory, wherein the first drive condition includes a drive condition of the gain region;
    driving the first thermo-cooler and the first heater based on the drive condition of the wavelength tunable laser diode;
    detecting temperature of the first thermo-cooler and a control value of the first heater;
    determining whether the detected temperature of the first thermo-cooler is reached within a first range of a first target value of the first thermo-cooler and the control value of the first heater is reached within a second range of a second target value of the first heater; and
    driving the gain region after the detected temperature has been reached within the first range and the control value has been reached within the second range;
    determining whether the detected temperature of the first thermo-cooler is reached within another range of the first target value after the driving the gain region, wherein the another range is narrower than the first range; and
    opening a shutter after the detected temperature of the first thermo-cooler has been reached within the another range.

2. The method of claim 1,
wherein the first heater includes a plurality of heaters, and
wherein the driving the gain region is performed after all the control values of the plurality of heaters are reached within the second range.

3. The method of claim 1,
wherein the wavelength tunable laser diode further includes a second wavelength selection region and a second heater, further comprising:
    acquiring a drive condition of the second heater from the memory;
    driving the second heater based on the drive condition of the second heater; and
determining whether a control value of the second heater is reached within a second third range of a third target value of the second heater,
wherein the driving the gain region is performed after the detected temperature of the first thermo-cooler has been reached within the first range, the control value of the first heater has been reached within the second range, and the control value of the second heater has been reached within the third range.

4. The method of claim 3,
wherein the control value of the second heater corresponds to electrical power value supplied to the second heater.

5. The method of claim 1,
wherein the control value of the first heater corresponds to electrical power value supplied to the first heater.

6. The method of claim 1,
wherein the laser device further includes a wavelength detection portion configured to detect an optical wavelength output from the wavelength tunable laser diode, and
wherein the first thermo-cooler is controlled based on a detection result of the wavelength detection portion.

7. The method of claim 1, further comprising:
outputting light beam from the wavelength tunable laser diode after the opening the shutter.

* * * * *

UNITED STATES PATENT AND TRADEMARK OFFICE
CERTIFICATE OF CORRECTION

| | |
|---|---|
| PATENT NO. | : 11,437,777 B2 |
| APPLICATION NO. | : 16/454801 |
| DATED | : September 6, 2022 |
| INVENTOR(S) | : Hirokazu Tanaka et al. |

It is certified that error appears in the above-identified patent and that said Letters Patent is hereby corrected as shown below:

In the Claims

Claim 3, Column 16, Line 37, "is reached within a second third range of a third target," should read --is reached within a third range of a third target,--.

Signed and Sealed this
Tenth Day of January, 2023

Katherine Kelly Vidal
*Director of the United States Patent and Trademark Office*